United States Patent
Chidambarrao et al.

(10) Patent No.: US 6,872,620 B2
(45) Date of Patent: Mar. 29, 2005

(54) TRENCH CAPACITORS WITH REDUCED POLYSILICON STRESS

(75) Inventors: Dureseti Chidambarrao, Weston, CT (US); Rajarao Jammy, Wappingers Falls, NY (US); Jack A. Mandelman, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/441,887

(22) Filed: May 20, 2003

(65) Prior Publication Data

US 2003/0201480 A1 Oct. 30, 2003

Related U.S. Application Data

(62) Division of application No. 09/904,612, filed on Jul. 13, 2001, now Pat. No. 6,653,678.

(51) Int. Cl.[7] .................. H01L 21/8242; H01L 21/20
(52) U.S. Cl. ............. 438/243; 438/386; 438/224; 438/253; 438/387; 438/396
(58) Field of Search .................. 438/386, 244, 438/253, 387, 396

(56) References Cited

U.S. PATENT DOCUMENTS

| | | | | |
|---|---|---|---|---|
| 5,936,271 A | * | 8/1999 | Alsmeier et al. | 257/301 |
| 6,326,658 B1 | * | 12/2001 | Tsunashima et al. | 257/301 |
| 6,436,760 B1 | * | 8/2002 | Wong et al. | 438/243 |
| 2003/0181006 A1 | * | 9/2003 | Schrems | 438/243 |

* cited by examiner

Primary Examiner—Jerome Jackson
Assistant Examiner—Joseph Nguyen
(74) Attorney, Agent, or Firm—Graham S. Jones, II; H. Daniel Schnurmann

(57) ABSTRACT

A Deep Trench (DT) capacitor in a semiconductor substrate has an isolation collar formed on trench sidewalls above the DT bottom. An outer plate is formed below the collar. Capacitor dielectric is formed on DT walls below the collar. An node electrode is formed in the DT, recessed below the DT top. The collar is recessed in the DT. A combined poly/counter-recrystallizing species cap is formed over the node electrode with a peripheral strap. The cap may be formed after formed a peripheral divot of a recessed collar, followed by forming an intrinsic poly strap in the divot and doping with a counter-recrystallization species, e.g. Ge, into the node electrode and the strap. Alternatively, the node electrode is recessed followed by codeposition of poly and Ge or another counter-recrystallization species to form the cap and strap.

23 Claims, 15 Drawing Sheets

TRENCH CAPACITORS WITH REDUCED POLYSILICON STRESS

This is a division of U.S. patent application Ser. No. 09/904,612; filed 13 Jul. 2001, now U.S. Pat. No. 6,653,678; entitled "Reduction of Polysilicon Stress in Trench Capacitors".

BACKGROUND OF THE INVENTION

1. Field of the Invention

This invention relates to integrated circuit devices and more particularly to deep trench capacitors and methods of manufacture thereof.

2. Description of Related Art

In trench capacitors, dislocations have been found to occur that have been closely associated with stress from polysilicon reorientation/recrystallization. Dislocations are of utmost concern in DRAM and eDRAM products using trench capacitors, since dislocations which occur in the vicinity of the strap outdiffusion are responsible for increased junction leakage and degraded retention time. During standard thermal processing, when the polysilicon in the trench recrystallizes and grain growth occurs, it shrinks (because the loss of grain boundaries from growth reduces the volume). As a result of such shrinkage, the polysilicon experiences significant tensile stresses. This in turn passes significant stresses from the polysilicon into the neighboring structure surrounding the trench, so much so that dislocations are punched out into the silicon active area which then can cause degraded data retention and other problems.

Although the use of pure germanium (Ge) or Silicon Germanium (Si/Ge) doped polysilicon has been proposed as a fill material for trench capacitors, the prior art teaches the use of germanium or germanium doped polysilicon filling the entire trench, which is not employed in this invention. See commonly assigned U.S. Pat. No. 6,180,480 of Economikos et al. for "Germanium or Silicon-Germanium Deep Trench Fill by Melt-Flow Process".

Loh et al. U.S. Pat. No. 5,998,253 for "Method for Forming a Dopant Outdiffusion Control Structure Including Selectively Grown Silicon Nitride in a Trench Capacitor of a DRAM Cell" forms a buried strap for coupling a trench capacitor to a doped junction of a transistor. The strap is composed of intrinsic (undoped) or lightly doped polysilicon, which is again different from the teachings of the present invention.

SUMMARY OF THE INVENTION

An advantage of this invention is that it reduces dislocation formation with very little process overhead.

The method and structure of this invention are adapted to being readily integrated into all the various Deep Trench (DT) applications for both planar and vertical DRAM/eDRAM applications.

Heretofore, in the absence of this invention it would have been required that germanium dopant should be introduced in situ because the very high dose required (>1E17 atoms/cm$^2$) is impractical to achieve using implantation.

In accordance with the method of this invention, a trench capacitor is formed having a top surface, a deep trench in a doped semiconductor substrate. The trench has a bottom, sidewalls and a top extending through the top surface of the substrate. A collar for isolation is formed on trench sidewalls substantially above the bottom. An outer plate of the trench capacitor is formed in the substrate at the bottom of the trench below the collar. A dielectric layer of the trench capacitor is formed on trench sidewalls below the collar. An inner node electrode of the trench capacitor is formed in the trench recessed below the top of the trench. The inner node electrode has an inner node electrode top surface. The method includes the processing steps of etching back the collar below the trench top surface, etching the capacitor inner node electrode below the top of the collar, and codepositing polysilicon and a counter-recrystallizing species over the collar and the inner node electrode top surface to form the cap and the strap.

Preferably, the trench capacitor is formed in a semiconductor substrate having a top surface. A trench formed in a doped semiconductor substrate has a bottom, sidewalls and a top extending through the top surface of the substrate. A collar for isolation is formed on the sidewalls of the trench substantially above the bottom thereof. An outer plate of the trench capacitor is formed in the substrate alongside the trench below the collar. A dielectric layer of the trench capacitor is formed on the walls of the trench below the collar. An inner node electrode of the trench capacitor is formed in the trench recessed below the top of the trench, the inner node electrode having an inner node electrode top surface. There is a recessed collar below the trench top surface. There is a recessed inner node electrode surface below the top of the collar.

Preferably, there is a codeposit of polysilicon and a counter-recrystallizing species in the inner node electrode and the strap.

Preferably, the capacitor includes a combination of polysilicon and germanium as a counter-recrystallizing species formed in at least one of the group consisting of the inner node electrode and the buried strap.

Preferably, the counter-recrystallizing species formed in the inner node electrode and the buried strap are formed with a dose more than about 1E15 atoms/cm$^2$.

BRIEF DESCRIPTION OF THE DRAWINGS

The foregoing and other aspects and advantages of this invention are explained and described below referring to the accompanying drawings, wherein.

DESCRIPTION OF THE PREFERRED EMBODIMENT

This invention seeks to avoid high tensile stress from polysilicon reorientation/recrystallization which is described above. During the deep trench process there is always a "built-in mask" when the buried strap polysilicon is deposited (due to the presence of the pad layers). Thus, we employ stress counter-doping by implanting materials composed of atoms of (Ge, Si, or any N+ implant from column IVA onwards in the periodic table, e.g. Sn, Pb, P, As, Sb, Bi, S, Se, Te, Po, Br, I, At) into the polysilicon in the deep trench in the vicinity of the strap.

This stress counterdoping implant then adds more material, to a local region of the polysilicon in the trench, to allow for a compressive counterbalance to the polysilicon reorientation/recrystallization. This implant also hinders grain boundary motion and growth by providing significant numbers of pinning sites.

Although the stress counterdoping implant doses have to be reasonably high, i.e. doses on the order of 1E15 atoms/$cm^2$ to provide enough counterbalance of the tensile stress, it is quite reasonable to achieve with available ion implanters and is acceptable for required throughput.

The stress counterdoping can be done even during an in situ process. However, for this aspect of the invention, a disposable spacer may be needed to protect the upper sidewalls of the trench (which will later serve as the gated surface of the vertical MOSFET) to prevent the material from going into the silicon active area.

This same stress counterdoping ion implant process can be used throughout the various polysilicon steps in the deep trench in both the planar and vertical DT (Deep Trench) DRAM and eDRAM applications.

Figure 1A:
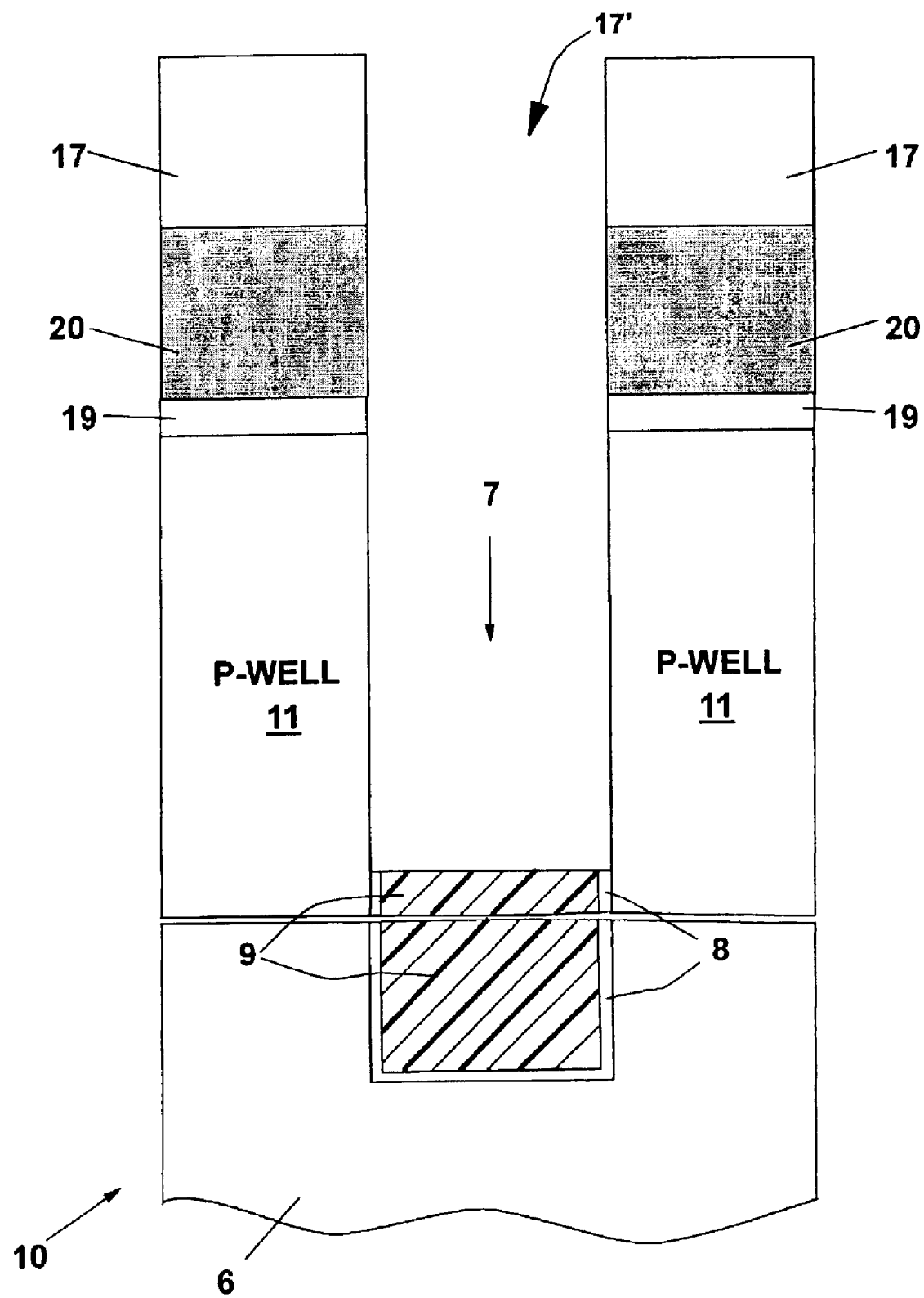
FIGS. 1A–1J show sectional views which illustrate the process steps leading to the formation of a deep trench capacitor in accordance with a first embodiment of the device and process of this invention.
Figure 1B:
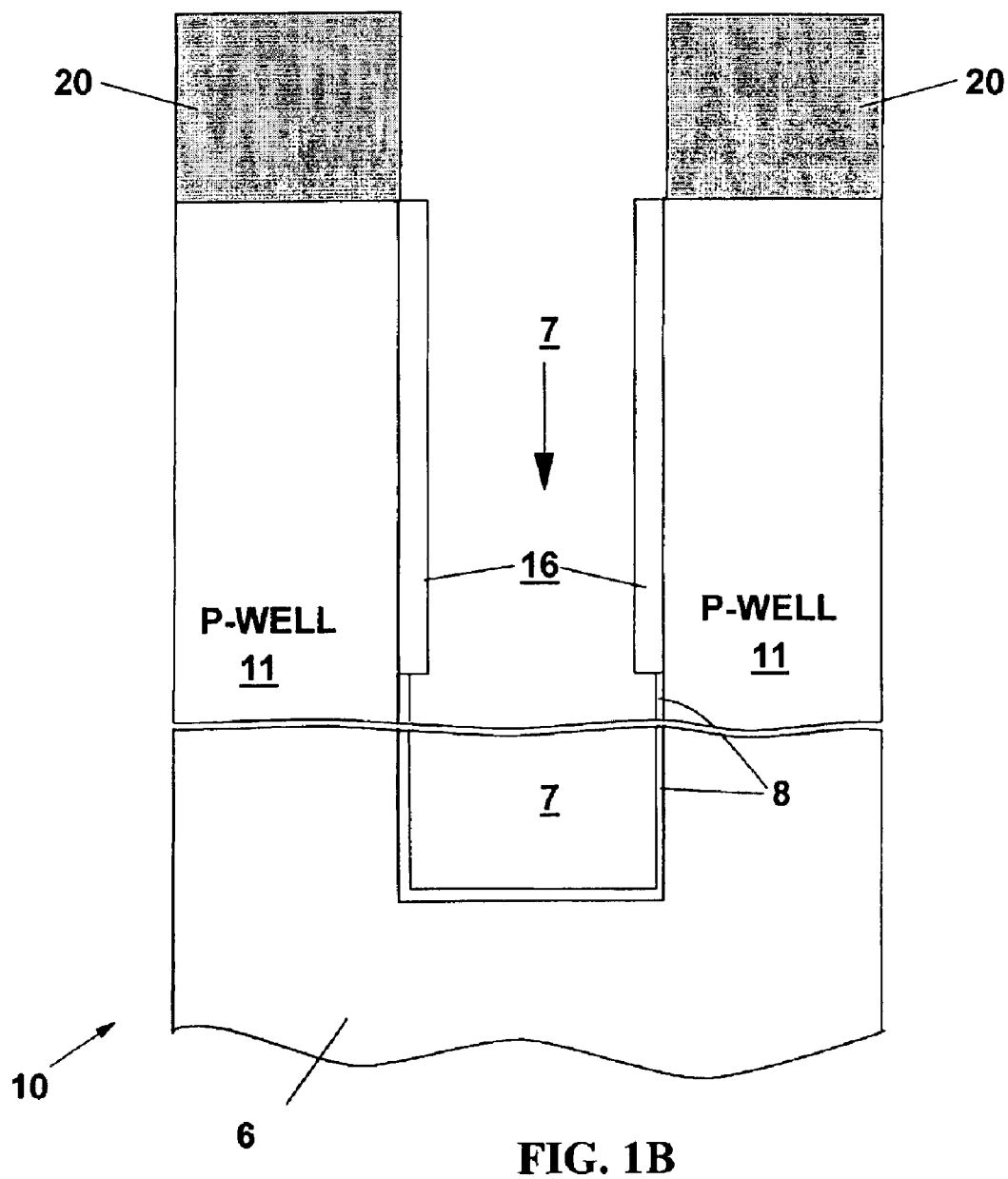
Figure 1C:
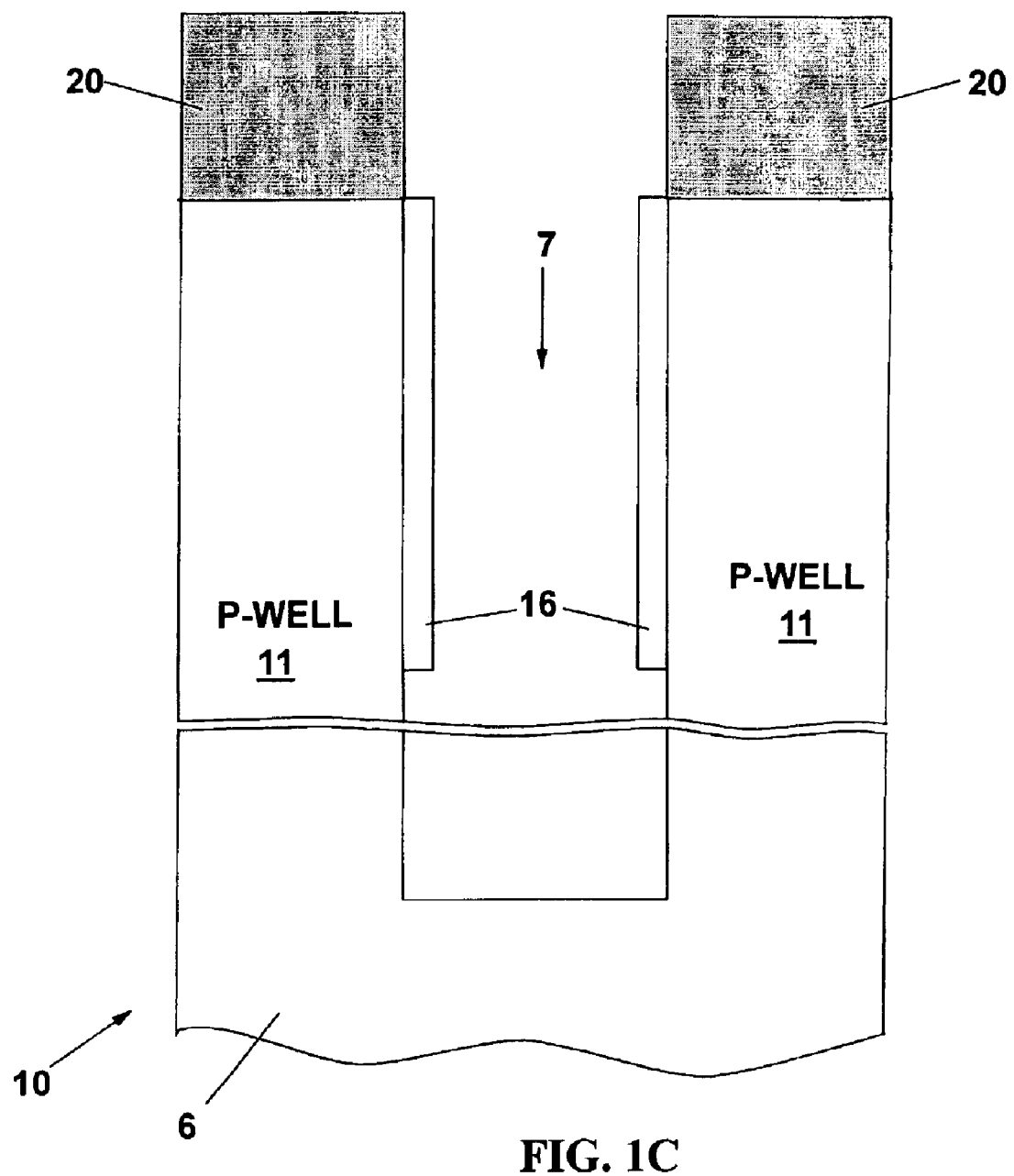
Figure 1D:
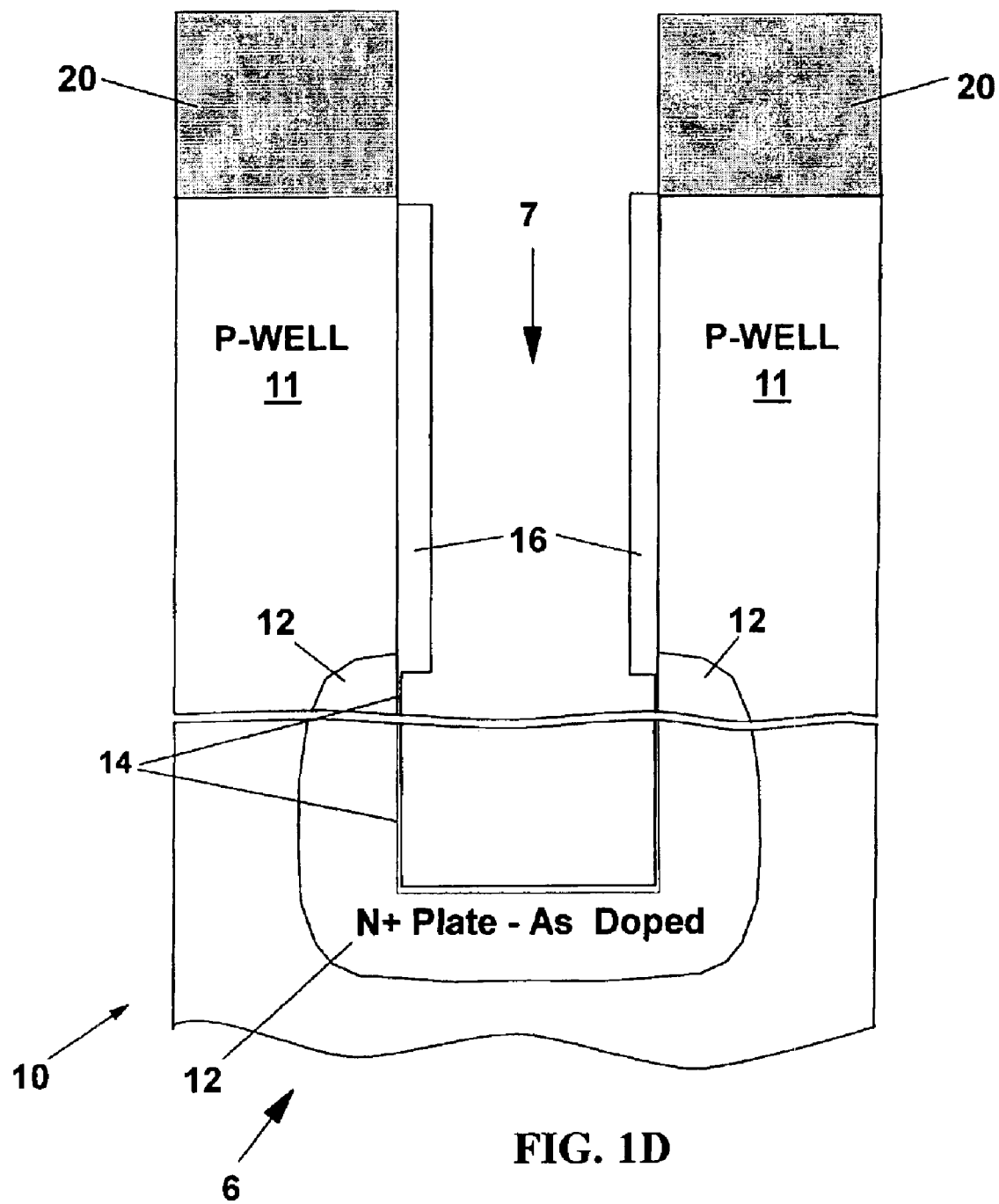
Figure 1E:
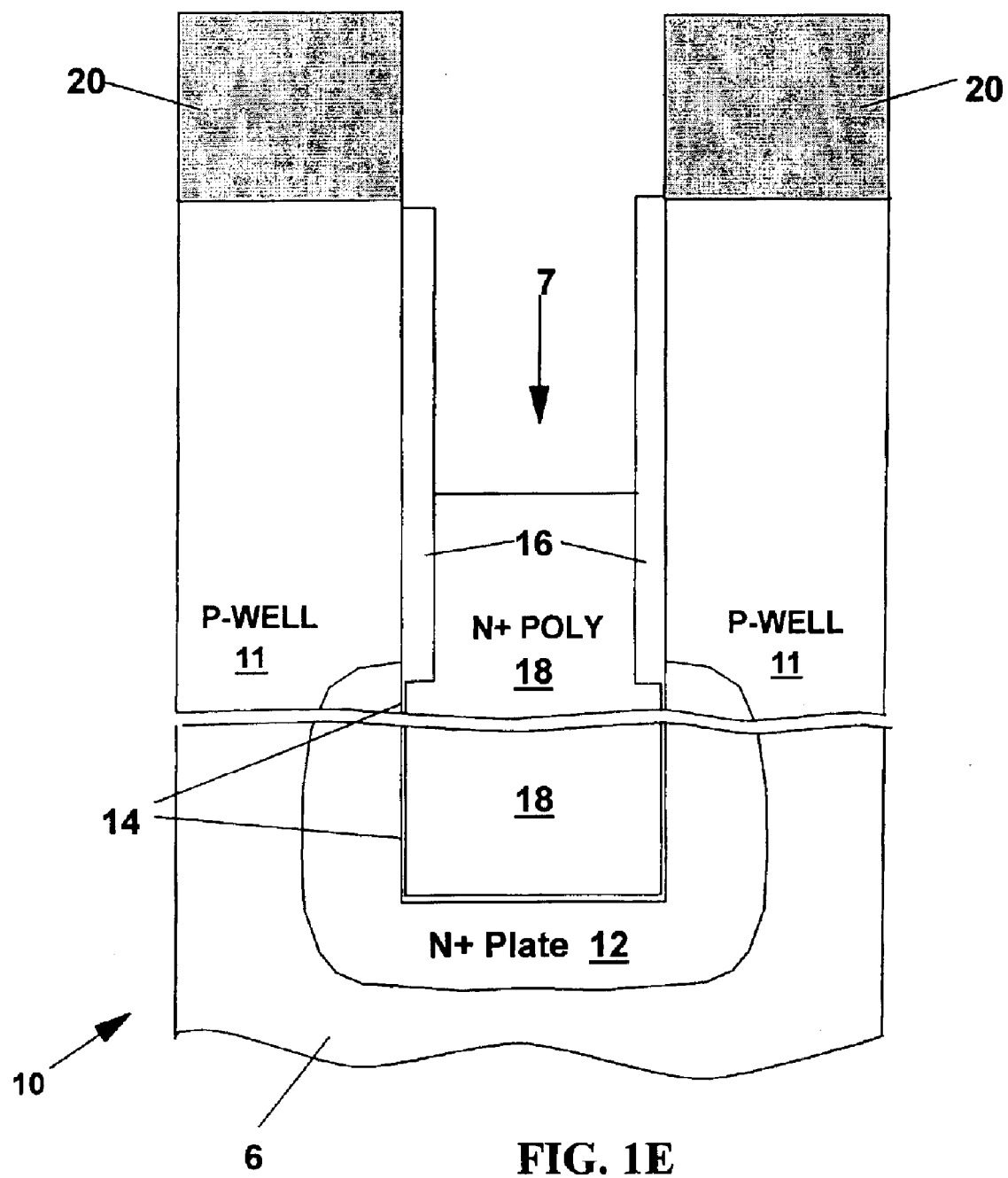
Figure 1F:
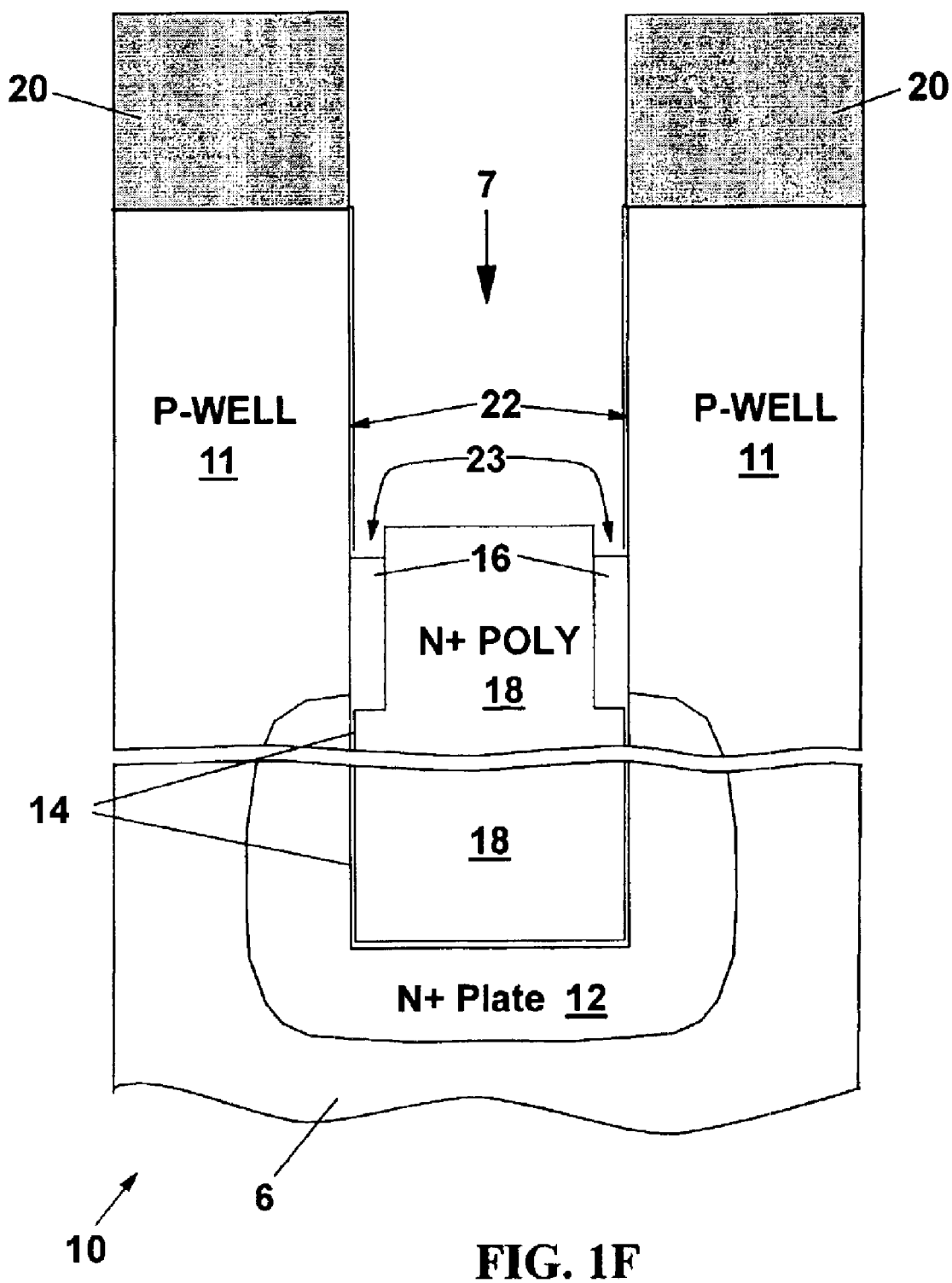
Figure 1G:
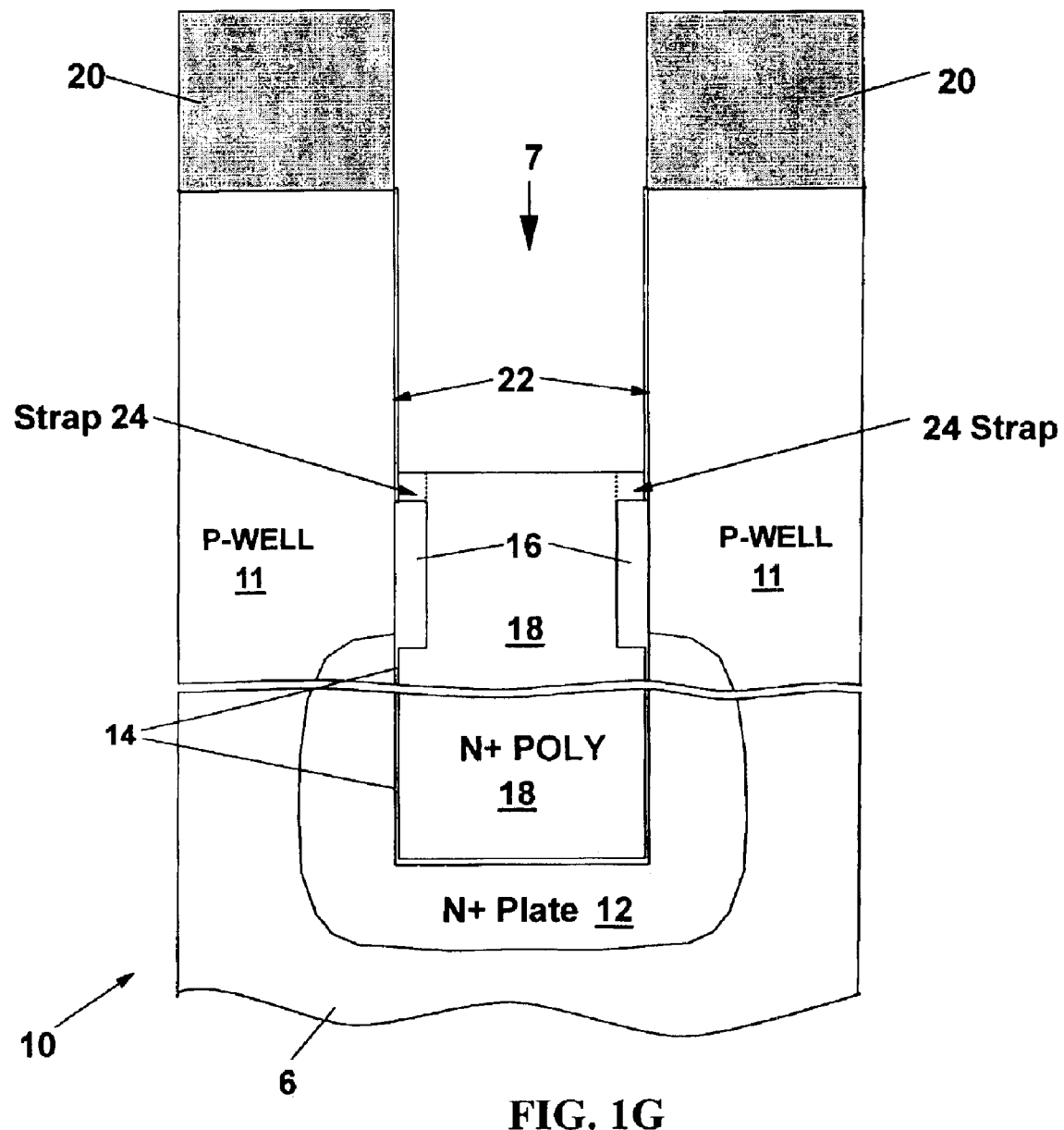
Figure 1H:
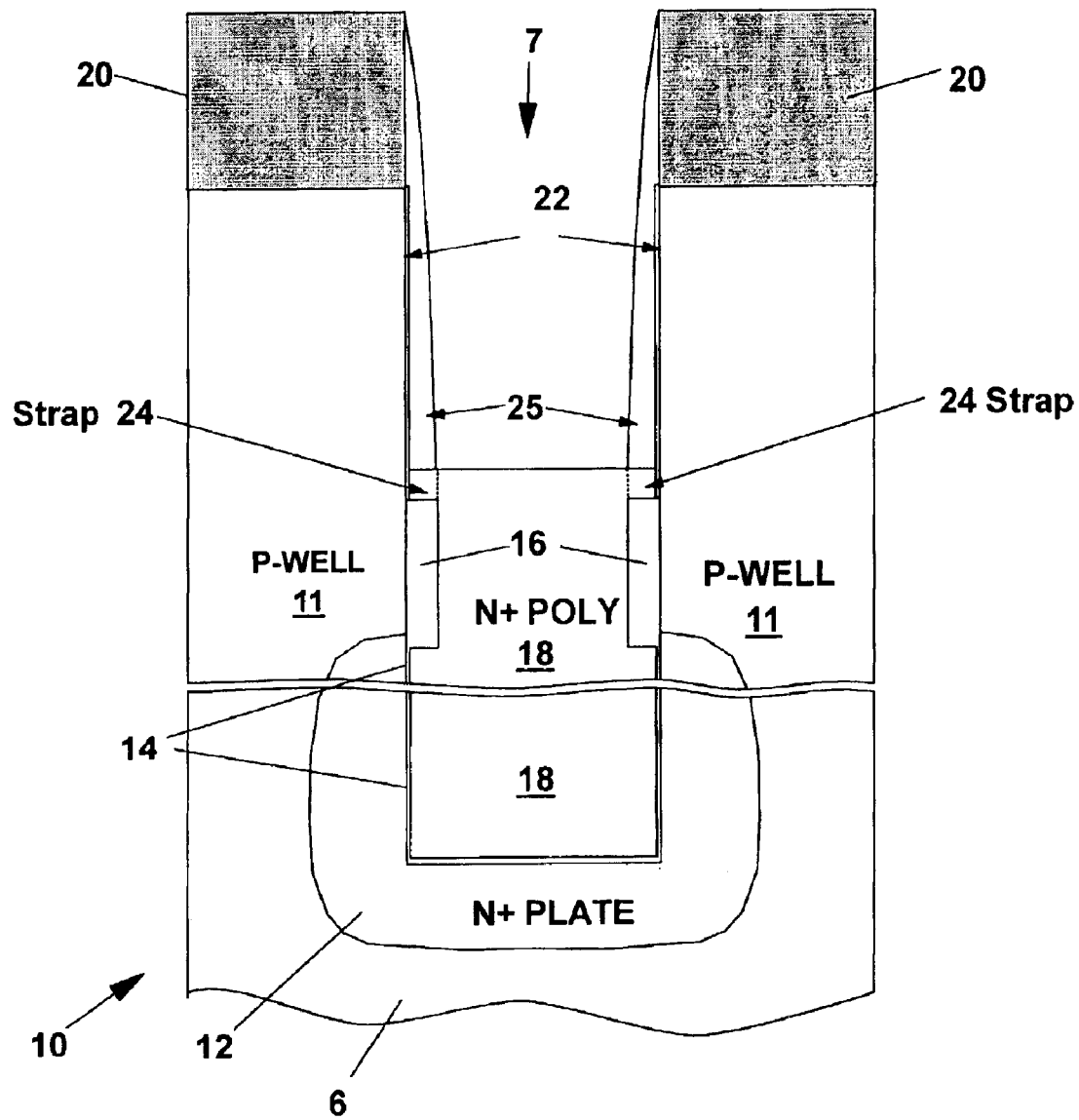
Figure 1I:
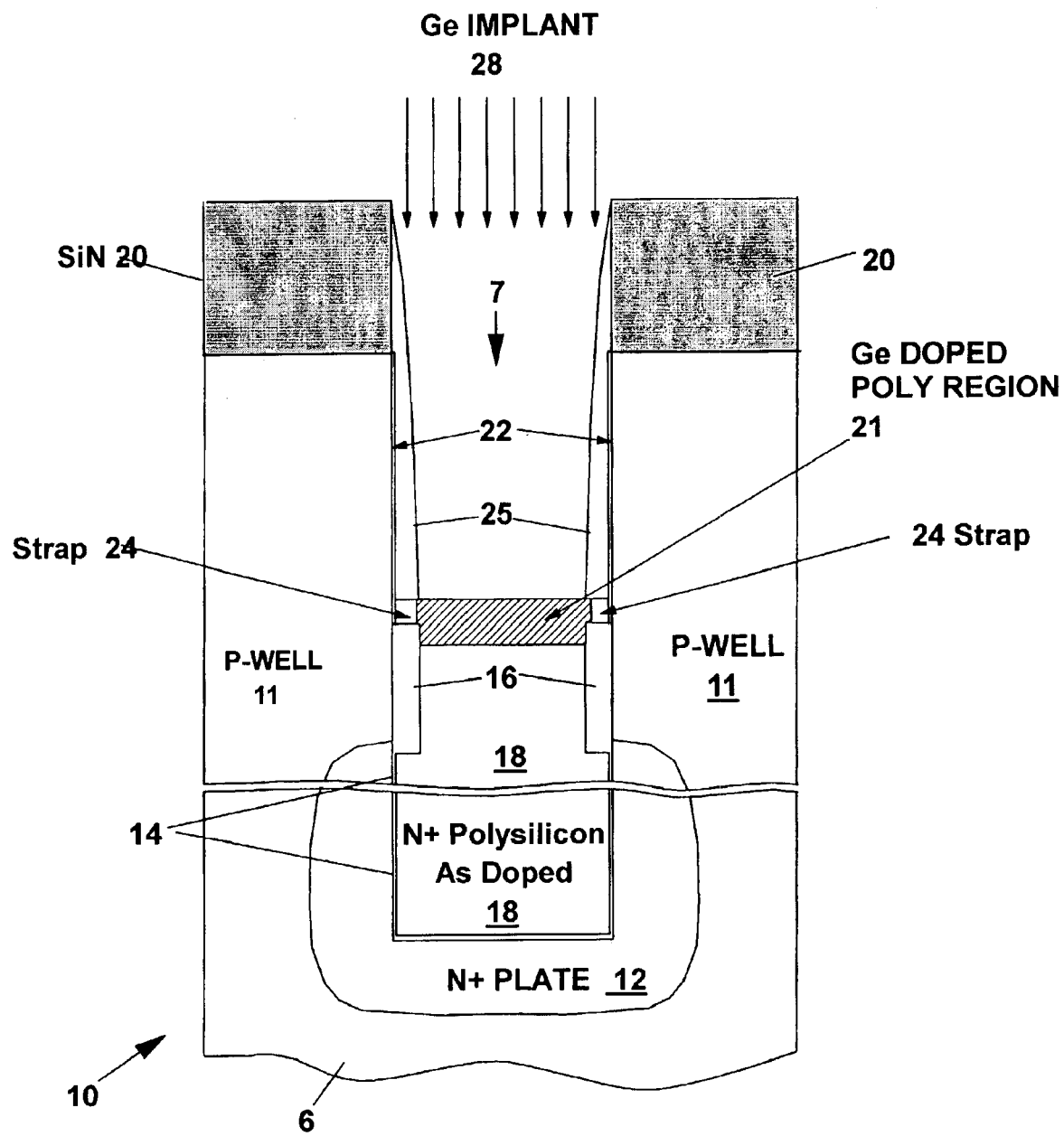

FIGS. 1A–1J are sectional schematic diagrams which illustrate a process of forming a deep trench capacitor 10 in a portion of a substrate 6, e.g. a semiconductor chip which contains a vertical DRAM cell. The process involves the introduction of local germanium (Ge) doping as shown by FIG. 1I into an inner, storage node electrode 18 composed of doped polysilicon of the capacitor 10 in the vicinity of the strap 24 (FIGS. 1G–1J) in the substrate 6.

Figure 1J:
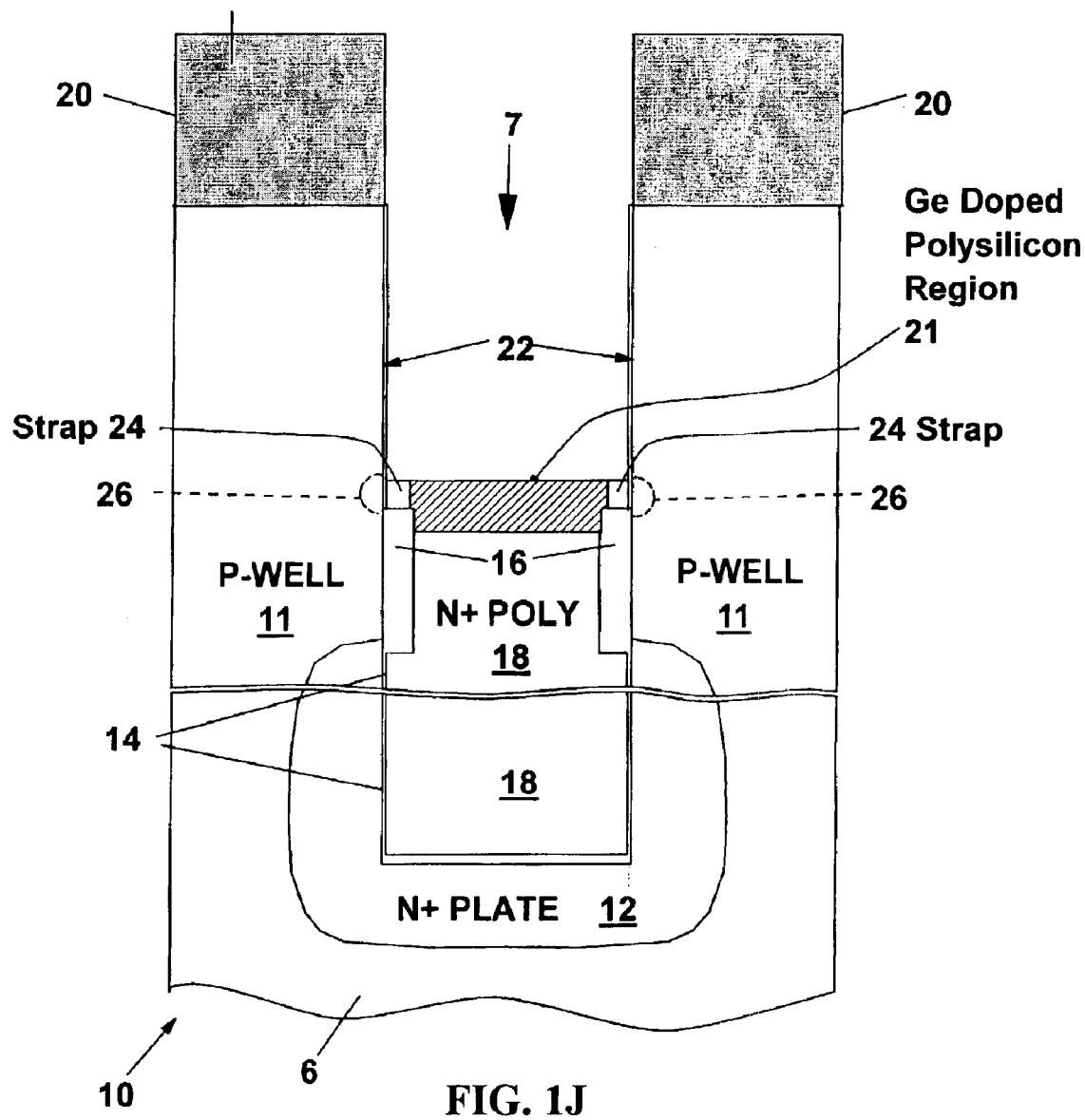

FIG. 1J shows the product of performing the following steps:

(a) Initial Processing Steps (i) Referring to FIG. 1A, the result of the of performing initial steps of manufacturing in forming a deep trench capacitor 10 in the substrate 6 of a microcircuit device. The process starts with the formation of a pad oxide layer 19 on the surface of the substrate 6 followed by forming both a silicon nitride mask 20 and a hard oxide mask 17, followed by etching a deep trench 7 in the substrate 6 in which a microcircuit device is being formed. The silicon nitride mask 20, the pad oxide 19 and the deep trench 7 are etched down to the P-well 11 through the opening 17' in the resist hard oxide mask 17. Standard lithography techniques are employed. Optionally, a pad oxide/pad nitride/oxide stack or just a pad nitride could be used.

Preferably, the deep trench capacitor 10 is formed in the substrate 6 which is preferably composed of a doped silicon semiconductor material.

Note that the deep trench 7 is shown broken away for convenience of illustration, since the deep trench 7 is preferably too deep to be illustrated on the page with the scale employed in the drawing.

(ii) Next, a thin film, silicon nitride liner 8 was conformally deposited on all surfaces of the deep trench 7. (As can be seen, the portions of the silicon nitride liner 8 above the recessed photoresist 9 have been removed prior to the stage of processing illustrated by FIG. 1A.)

(iii) Then the photoresist 9 was deposited into the deep trench 7 and recessed (as shown) to provide a desired depth of the bottom of the isolation collar 16 which has not yet been formed in FIG. 1A, but which is shown in FIGS. 1B–1J.

(iv) Then a portion of the silicon nitride liner 8 of step (ii) which was exposed above the recessed photoresist 9 was etched away, thereby exposing the upper, silicon sidewalls of the P-well 11 in the upper portion of the deep trench 7.

(v) Next, referring to FIG. 1B the product of FIG. 1A is shown after the remaining portion of the recessed photoresist 9 was removed leaving all of the silicon nitride liner 8 exposed in the deep trench 7.

(vi) Then only the exposed silicon surfaces of the P-well 11 in the deep trench 7 above the silicon nitride liner 8 were oxidized thereby forming an isolation collar 16 composed of silicon oxide. Thus the isolation collar 16 extends from the top surface of the remaining portions of the silicon nitride liner 8 up to the top of the deep trench 7, as is shown by FIG. 1B.

(vii) FIG. 1C shows the product of FIG. 1B after stripping the remaining portions of the silicon nitride liner 8 from the lower portion of the deep trench 7, exposing the lower silicon surfaces of the substrate 6 in the deep trench 7, below the isolation collar 16.

(viii) FIG. 1D shows the product of FIG. 1C after the step of doping an N+ doped outer plate electrode 12, i.e. an N+ doped region at the bottom of the deep trench 7 thereby forming the outer electrode of the deep trench capacitor 10, where the substrate 6 was exposed to the opening defined by the portion of the deep trench 7 below the isolation collar 16 followed by formation of a thin film layer comprising the node dielectric 14, preferably composed of a thin layer of silicon nitride and silicon oxide stack, of the deep trench capacitor 10.

First, the doping of the N+ doped, outer plate electrode 12 may be performed by depositing an Arsenic-doped Silicon Gas (ASG) dopant source (that has been removed) into the deep trench 7. Then the dopant is driven by diffusion from the deep trench 7 into the substrate 6 to form the outer plate electrode 12, i.e. the outer electrode of the capacitor.

Alternately, arsenic gas phase doping may be used to dope outer plate electrode 12.

Next, as can be seen in FIG. 1D, the ASG dopant source was removed from the deep trench 7. Before removal of the ASG dopant source, a drive-in step was performed, during which the dopant was diffused to form the N+ doped outer plate electrode 12.

In any event, the N+ doped outer plate electrode 12 was formed by doping as the arsenic diffused into the exposed portion of the substrate 6 on the lower portion of the deep trench 7, while the P-well 11 is masked by the isolation collar 16 in the upper portion of the deep trench 7.

(ix) Next, as shown in FIG. 1D, the thin film, node dielectric 14, which as is conventional is formed of a thick silicon nitride/silicon oxide stack on the exposed surfaces of the N+ doped outer plate electrode 12 at the bottom of the deep trench 7, below the isolation collar 16. Ultimately, as noted above, the node dielectric 14 will comprise the dielectric between the two plates of the deep trench capacitor 10 which is being formed in the substrate 6, with the N+ outer plate electrode 12 comprising the outer plate of that capacitor 10.

(x) FIG. 1E shows the product of FIG. 1D after deposition of the inner, storage node electrode 18 of the capacitor 10, which comprises an N+ doped polysilicon node or plug which initially filled trench 7 to the top. However in FIG. 1E, the inner, storage node electrode 18 is shown after the doped polysilicon (18) was recessed (by etching) to the depth at which the strap 24 is to be located (as shown in FIGS. 1G–1J As stated above, the top of the inner, storage node electrode 18 of the capacitor 10 is located in the vicinity of the strap 24. The N+ doped polysilicon inner, storage node electrode 18 of the capacitor 10 is located on the opposite side of node dielectric 14 from the outer plate electrode 12 which surrounds the lower end of the node dielectric 14 and the inner, storage node electrode 18.

xi) FIG. 1F shows the product of FIG. 1E after etching the upper portion of the exposed silicon oxide of the isolation collar 16 which is not protected by the inner, storage node electrode 18.

The etching step continues beyond the point at which the sidewalls of the P-well 11 in the deep trench 7 are exposed thereby recessing the isolation collar 16 below the top of inner, storage node electrode 18. This step forms a peripheral divot 23 (recess) in the top of the isolation collar 16 which extends well below the top of the inner, storage node electrode 18 of the capacitor 10, i.e. the N+ doped polysilicon 18 in the trench 7.

(xii) Next, as shown further in FIG. 1F, a thin $Si_3N_4$ etch stop barrier layer 22 (e.g. having a thickness of about 0.7 nm) is formed on the exposed the walls of the deep trench 7, i.e. the sidewalls of the P-well 11, so the thin SiN diffusion/etch stop barrier layer 22 extends from the top of the deep trench 7 down to the base of the divot 23 along the sidewalls of the P-well 11 reaching to the recessed top of the isolation collar 16.

(xiii) FIG. 1G shows the product of FIG. 1F after the buried strap 24 has been formed by deposition of intrinsic polysilicon into the deep trench 7 in a Buried Strap Polysilicon Etchback (BSPE) process. Then the excess intrinsic (undoped) polysilicon was etched back producing the buried strap 24 which filled the divot 23 to be coplanar with the top surface of the capacitor inner, storage node electrode 18.

Strap 24 comprises a region (filling the divot 23) located on the periphery of the top of the inner, storage node electrode 18, which in a finished microcircuit device will electrically interconnect the bulk of the cap 21 (as well as the inner, storage node electrode 18 therebelow) with the strap outdiffusion region 26 shown in phantom in FIG. 1J, which will be formed by outdiffusion of N+ dopant from the inner, storage node electrode 18 during annealing of the microcircuit device 6 subsequent to the processing steps of this invention.

Thus, after microcircuit device 6 has been processed into a finished product the strap 24 will interconnect the bulk of the cap 21 and the inner, storage node electrode 18 with the strap outdiffusion region 26 shown in phantom in FIG. 1J.

(b) Form Spacers

FIG. 1H shows the product of FIG. 1G after depositing a blanket of a bulk layer of silicon oxide into the deep trench 7 covering etch stop barrier layer 22, by a process such as CVD that initially had filled the deep trench 7. Then the bulk layer of silicon oxide was etched back to form disposable/sacrificial protective sidewall spacers 25.

The sidewall spacers 25 (CVD oxide, resist) are formed to prevent contamination of the upper sidewalls of the P-well 11, during the later step of implanting a counterdopant 28 comprising a counter-recrystallizing species which is described below in connection with FIG. 1I.

(c) Implant of Counter-Recrystallizing Species

FIG. 1I shows the product of FIG. 1H after formation of a cap 21 in the top surface of capacitor inner, storage node electrode 18 by implantation of the counterdopant 28 (i.e. the counter-recrystallizing species). The implanting of counter-doping ions 28 occurs as the counterdopant 21 passes through the upper, open portion of the deep trench 7 into the top surface of the (N+ doped polysilicon) inner, storage node electrode 18 creating a counterdoped polysilicon cap 21 on the surface of inner, storage node electrode 18. As shown, the cap 21 has been doped with the counterdopant species 28, e.g. Germanium (Ge), to form the cap 21 which is the top, counterdoped portion of the inner, storage node electrode 18. In general, the energy of ion implantation of the counterdopant species 28 must be small.

In the case of Ge counterdopant 28, the Ge is implanted at a low energy, e.g. about 5 keV to about 10 keV. The counterdopant species 28 is implanted with as high a dose as the manufacturing process and implanters allow (e.g. 1E15 ions/cm$^2$–1E16 ions/cm$^2$). For example, a relatively heavy dose (>1E15 atoms/cm$^2$) of the counter-recrystallizing species (Ge) is implanted into the recessed N+ doped polysilicon fill of the inner, storage node electrode 18. This creates a heavily doped SiGe localized region in the vicinity of the strap 24, that inhibits recrystallization, counter-balancing of the normally encountered tensile stress.

(d) Strip Disposable Spacers

FIG. 1J shows the product of FIG. 1I after the step of stripping the disposable spacers 25 from the deep trench 7 by a conventional, selective subtractive process for removal of silicon oxide without damaging the remaining structure, as will be well understood by those skilled in the art. As stated above, FIG. 1J shows the strap outdiffusion region 26 in phantom which was formed by outdiffusion of N+ dopant from the inner, storage node electrode 18 during annealing of the micro-circuit device 6 subsequent to the processing steps of this invention.

The remainder of the process of forming a deep trench fill and further processing to produce bit-line and word-line formations, which is then followed by the Back-End Of the Line (BEOL) processing are standard, as will be well understood by those skilled in the art.

Standard processing follows, which includes formation of Trench Top Oxide (TTO), gate dielectric, gate conductor, isolation end higher levels of wiring (WLs and BLs and higher) and interlevel dielectrics.

In an alternate embodiment of FIGS. 2A–2E, the polysilicon used to form the cap and strap on the top surface of the inner node electrode may be deposited in situ, e.g. comprising cap-strap polysilicon doped with germanium. In situ germanium doped buried-strap polysilicon is deposited and recessed to remove the cap-strap polysilicon from the sidewalls. This creates a heavily doped SiGe localized region in the vicinity of the strap, which inhibits recrystallization and counterbalances the normally encountered tensile stress.

Standard processing follows, which includes formation of trench top oxide (TTO), gate dielectric, gate conductor, isolation and higher levels of wiring (WLs and BLs and higher) and interlevel dielectrics.

Second Embodiment

FIGS. 2A–2E illustrate the process steps for forming a second embodiment of a deep trench capacitor 110 manufactured in accordance with a second processing sequence in accordance with this invention, which is a modification of the process of FIGS. 1A–1J.

Figure 2A:
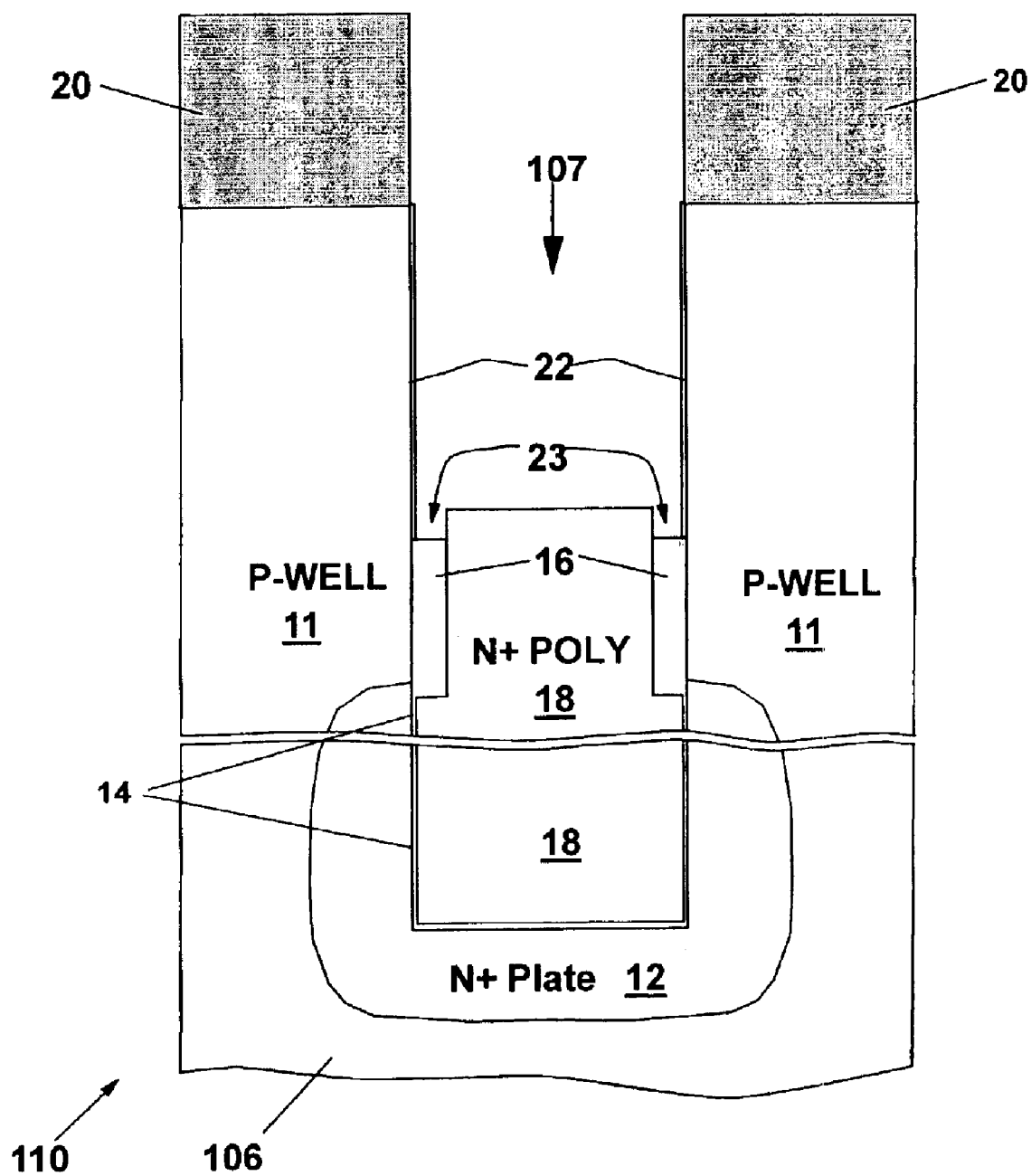
FIGS. 2A–2E show sectional views which illustrate the process steps leading to the formation of a deep trench capacitor in accordance with a second embodiment of the device and process of this invention.

FIG. 2A is similar to FIG. 1F with like reference numbers identifying like elements in the drawings. The capacitor 110 is formed in the substrate 106 of a microcircuit device and the deep trench 107 has the N+ doped electrode comprising the outer capacitor plate electrode 12 formed at the bottom of the substrate 106. The node dielectric layer 14 is formed on the surface of the inner, storage node electrode 12. The isolation collar 16 is formed on the walls of the deep trench 107 bridging from the inner, storage node electrode 18 up along the sidewalls of the P-well 11.

As in FIG. 1F, the isolation collar 16 of FIG. 2A has been etched back until it is substantially recessed below the top of the inner, storage node electrode 18 and thereby forming the peripheral divot 23 comprising a recess forming a strap opening in the top of the isolation collar 16, which extends well below the top of the inner, storage node electrode 18, i.e. N+ doped polysilicon 18 in the trench 107.

In addition, the thin $Si_3N_4$ etch stop barrier layer 22 (e.g. having a thickness of about 0.7 nm) has been formed on the exposed the walls of the deep trench 107, i.e. the sidewalls of the P-well 11. Thus, the thin SiN diffusion/etch stop barrier layer 22 extends from the top of the deep trench 7 down into the divot 23 along the sidewalls of the P-well 11 reaching to the recessed top of the isolation collar 16.

Figure 2B:
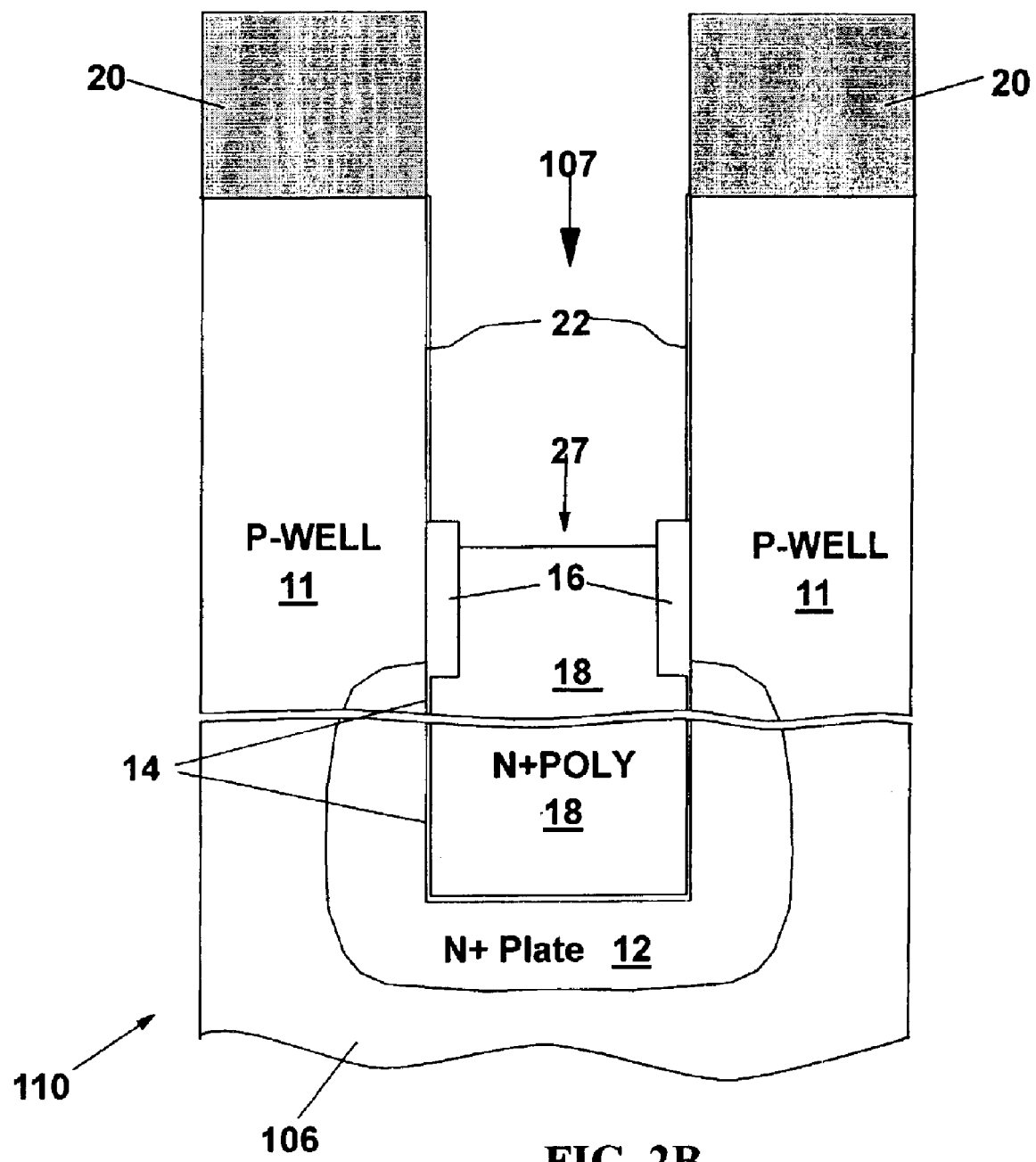

In FIG. 2B, the device 106 of FIG. 2A is shown after performing a step in which the process of the second embodiment diverges from the process of the first embodiment in that the top surface of the inner, storage node electrode 18 has been etched back to a lower level thereby forming a recess 27 below the top level of the isolation collar 16 in the deep trench 107.

Figure 2C:
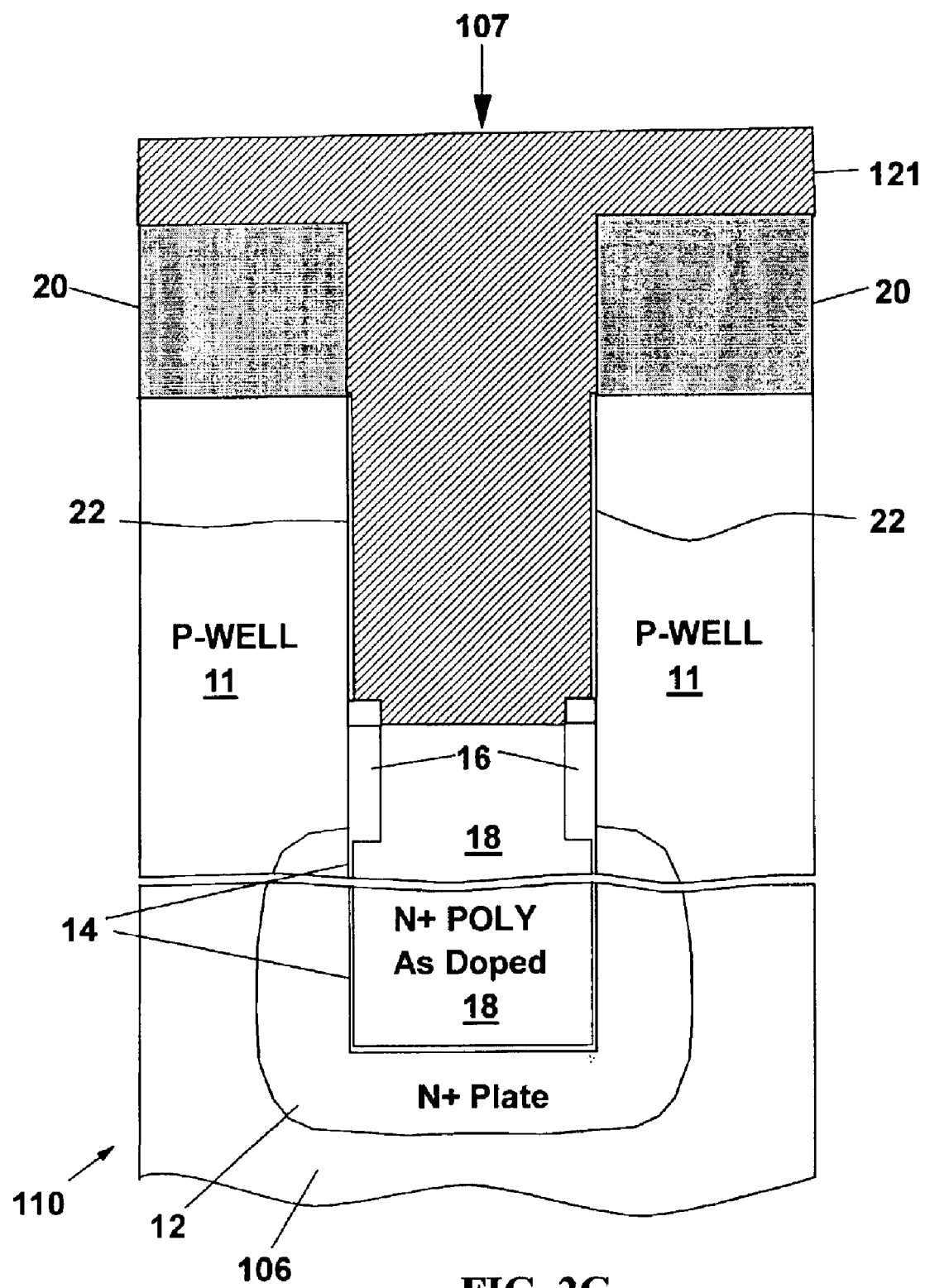

In FIG. 2C, the device of FIG. 2B is shown after a blanket deposition of a combination comprising a germanium (Ge) doped polysilicon layer 121 instead of intrinsic (undoped) polysilicon which in this case is deposited covering the pads 20 and overfilling the trench 107 and of course filling the recess 27 thereby covering the top of the inner, storage node electrode 18.

Figure 2D:
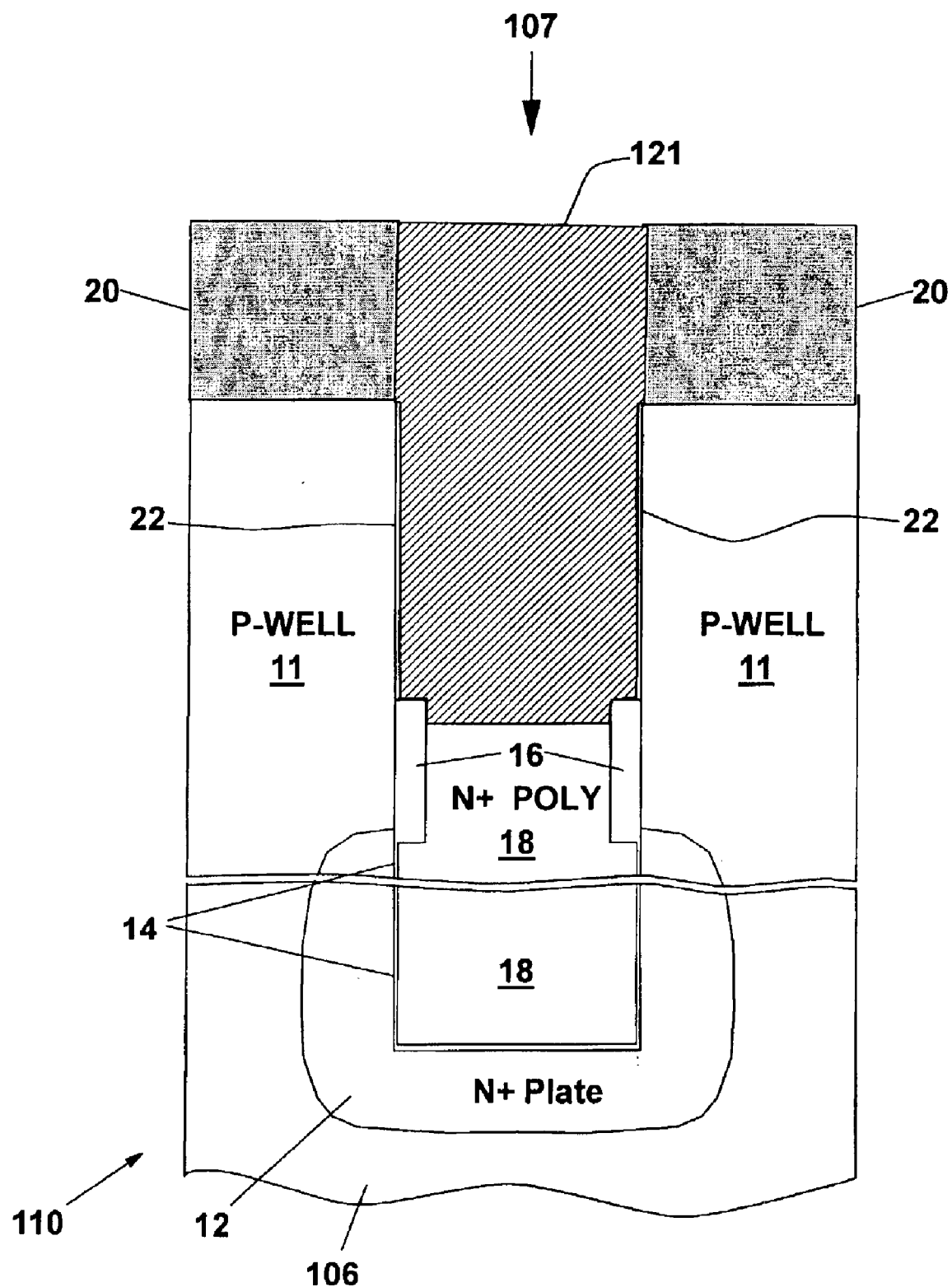

FIG. 2D shows the device of FIG. 2C after planarizing of the silicon germanium layer 121 to the top of the deep trench 107, uncovering the top surface of the silicon nitride pads 20.

Figure 2E:
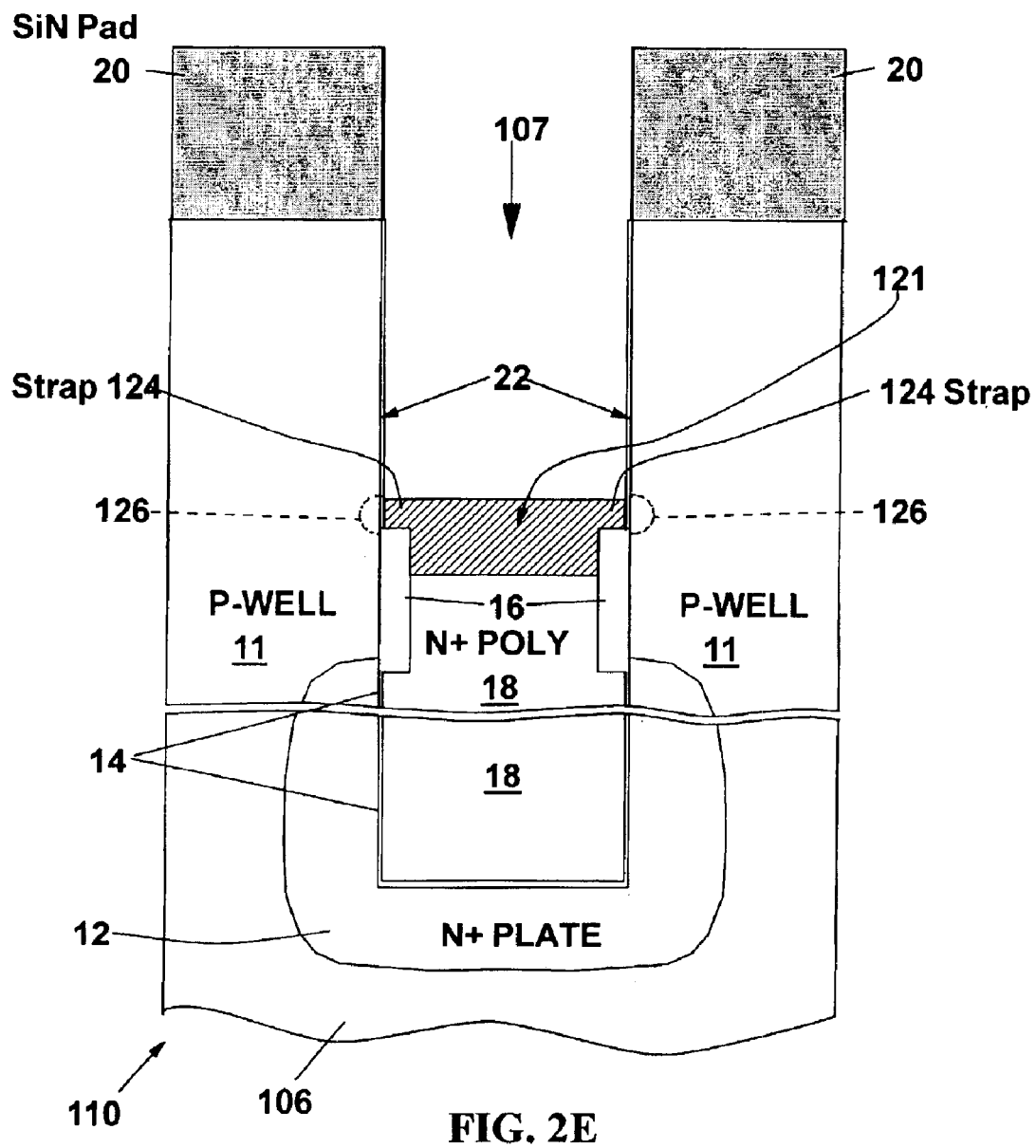

FIG. 2E shows the device of FIG. 2D after etching back the silicon germanium layer 121 to form a cap 121 generally similar to the cap of FIG. 1J except that the divot space for a strap on the periphery of the cap 121 has been filled by cap 121. However there is a strap 124 formed in cap 121, which comprises the region on the periphery of the cap 121.

After processing the microcircuit device formed on substrate 106 into a finished product, the strap 124 will interconnect the bulk of the cap 121 and the inner, storage node electrode 18 with the strap outdiffusion region 126 shown in phantom in FIG. 2E.

The strap outdiffusion region 126 is formed by outdiffusion of N+ dopant from the inner, storage node electrode 118 through the cap 121 into the closest region 126 of the P-well 11 during annealing of the microcircuit device formed on substrate 106, subsequent to the processing steps of this invention.

Note that control of the strap opening (divot 23) is subject to controllability of two recesses which (while not easily done) is feasible.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a trench capacitor in a semiconductor substrate having a top surface, including the steps as follows:

forming a trench with a top, a bottom, and sidewalls in the substrate, forming a collar for isolation on the sidewalk of the trench, forming an outer capacitor plate in the substrate below the collar, forming a node dielectric layer on the sidewalk of the trench below the collar, forming a capacitor node electrode in the trench over the node dielectric, etching back the collar forming a lowered collar top within the trench, and forming a cap of polysilicon and a germanium counter-recrystallizing species on top of the node electrode while concomitantly forming a strap on the edge of the cap.

2. The method of claim 1 including forming a combination of silicon and a counter-recrystallizing species in at least one of the group consisting of the inner, node electrode and the buried strap by a step selected from the steps as follows:

(a) implanting a germanium counter-recrystallizing species into the node electrode, and (b) codepositing the germanium counter-recrystallizing species with polysilicon.

3. The method of claim 1 including the steps prior to forming the cap comprising:

etching back the collar below the node electrode thereby forming a recess about the edge of the top of the node electrode, forming a diffusion/etch stop barrier on the sidewalls of the trench above the etched back collar reaching down along the recess, forming an intrinsic, undoped, polysilicon buried strap in the recess, and forming silicon with the germanium counter-recrystallizing species in at least one of the group consisting of the node electrode top surface and the buried strap.

4. The method of claim 3 wherein the germanium counter-recrystallizing species is implanted into the node electrode top surface and into the buried strap.

5. The method of claim 3 with implanting of the germanium counter-recrystallizing species into the node electrode and buried strap with a dose more than about 1E15 atoms/cm$^2$.

6. The method of claim 1 wherein a cap is formed by the steps comprising:

etching the node electrode below the lowered top of the collar, and depositing silicon with the germanium counter-recrystallizing species in at least one of the group consisting of the node electrode top surface and the buried strap.

7. A method of forming a trench capacitor in a semiconductor substrate having a top surface wherein prior to forming the cap the collar is etched back below the node electrode top surface thereby forming a recess about the edge of the of the node electrode top surface as follows:

forming a trench with a top, a bottom, and sidewalls in the substrate, forming a collar for isolation on the sidewalls of the trench, forming an outer capacitor plate in the substrate below the collar, forming a node dielectric layer on the sidewalls of the trench below the collar, forming a capacitor node electrode in the trench over the node dielectric, etching back the collar forming a lowered collar top within the trench, forming a cap on top of the node electrode while concomitantly forming a strap on the edge of the cap, forming an intrinsic, undoped, polysilicon buried strap in the recess, and forming a combination of polysilicon and a codeposit therewith or implant therein of germanium as a counter-recrystallizing species in at least one of the group consisting of the node electrode top surface and the buried strap.

8. The method of claim 7 including:

the collar being located substantially above the bottom of the trench, the outer capacitor plate being formed in the substrate at the bottom of the trench, the node electrode comprising an inner, storage node electrode of the capacitor formed in the trench, recessed below the top of the trench with the inner, storage node electrode having an inner, storage node electrode top surface.

9. The method of claim 8 including combining silicon and the germanium counter-recrystallizing species in at least one of the group consisting of the inner, storage node electrode top and the buried strap by a step selected from the steps as follows:

(a) implanting the germanium counter-recrystallizing species into the inner, storage node electrode top surface, and (b) codepositing the germanium counter-recrystallizing species with polysilicon.

10. The method of claim 9 including the steps prior to forming the cap comprising;

etching back the collar below the inner, storage node electrode top surface thereby forming a divot recessed about the edge of the top of the polysilicon capacitor node electrode, forming a diffusion/etch stop barrier on the sidewalls of the trench above the etched back collar reaching down along the divot, forming an intrinsic, undoped, polysilicon buried strap in the divot, and forming a combination of silicon and the germanium counter-recrystallizing species in at least one of the group consisting of the node electrode and the buried strap.

11. The method of claim 9 wherein the germanium counter-recrystallizing species is implanted into the node electrode and into the buried strap.

12. The method of claim 9 wherein the germanium counter-recrystallizing species is implanted into the node electrode top surface and into the buried strap with a dose greater than about 1E15 atoms/cm$^2$.

13. The method of claim 8 wherein a cap is formed by the steps comprising:

etching the node electrode below the lowered top of the collar, and codepositing silicon and the germanium counter-recrystallizing species in at least one of the group consisting of the node electrode top surface and the buried strap.

14. The method of claim 8 including etching back the collar below the node electrode top surface before forming the cap to form a divot recessed on the edge of the node electrode top surface, by the steps comprising:

forming an intrinsic, undoped, polysilicon buried strap in the divot, and forming a combination of the polysilicon and the germanium counter-recrystallizing species in at least one of the group consisting of the node electrode top surface and the buried strap.

15. The method of forming a trench capacitor in a semiconductor substrate having a top surface including:

forming a trench with a top, a bottom, and sidewalls in the substrate, forming a collar for isolation on the sidewalls of the trench, forming an outer capacitor plate in the substrate below the collar, forming a node dielectric layer on the sidewalls of the trench below the collar, forming a capacitor node electrode in the trench over the node dielectric, etching back the collar forming a lowered collar top within the trench, forming a codeposit of a cap of polysilicon and a germanium counter-recrystallizing species on top of the node electrode while concomitantly forming a strap on the edge of the cap, the trench in the doped semiconductor substrate extending through the top surface of the substrate, the collar for isolation being formed on the sidewalls of the trench substantially above the bottom thereof, the node electrode of the trench capacitor being formed in the substrate at the bottom of the trench below the collar, the node dielectric layer of the trench capacitor comprising a thin film, a node electrode of the trench capacitor formed in the trench recessed below the top of the trench having a node electrode top with an node electrode top surface, and the collar having been etched back below the node electrode top surface thereby forming a divot recessed about the edge of the of the node electrode top surface the processing step including forming a combination of the polysilicon and the germanium counter-recrystallizing species in at least one of the group consisting of the node electrode top surface and the buried strap.

16. The method of claim 15 including the steps prior to forming the cap comprising:

etching back the collar below the node electrode top surface thereby forming the divot, forming a diffusion/etch stop barrier on the sidewalls of the trench above the etched back collar reaching down along the divot recessed, and forming an intrinsic, undoped, polysilicon buried strap in the divot recessed about the edge of the of the node electrode top surface.

17. The method of claim 15 wherein a cap is formed by the steps comprising:

etching to recess the node electrode top surface below the lowered top of the collar, and then codepositing silicon and the germanium counter-recrystallizing species in at least one of the group consisting of the node electrode top surface and the buried strap.

18. The method of claim 15 wherein prior to forming the cap, the collar is etched back below the node electrode top surface to form a divot recessed about the edge of the of the node electrode top surface, including the step comprising forming a combination of the polysilicon and the germanium counter-recrystallizing species in at least one of the group consisting of the node electrode top surface and the buried strap.

19. The method of claim 1 comprising:
the trench extending through the top surface of the substrate,
the collar for isolation being formed on the sidewalls of the trench substantially above the bottom thereof,
the outer capacitor plate of the trench capacitor being formed in the substrate at the bottom of the trench below the collar,
the capacitor node electrode of the trench capacitor formed in the trench being recessed below the top of the trench,
the node electrode having an node electrode top surface,
etching back the collar below the trench top surface,
etching the capacitor node electrode below the top of the collar, and
codepositing the polysilicon and the germanium counter-recrystallizing species over the collar and the node electrode top surface to form the cap and the strap.

20. The method of claim 19 wherein the germanium counter-recrystallizing species is implanted into the node electrode and the buried strap with a dose above about 1E15 atoms/cm$^2$.

21. The method of claim 19 including forming a combination of the polysilicon and the germanium counter-recrystallizing species in at least one of the group consisting of the node electrode top surface and the buried strap.

22. The method of claim 19 including:
forming a diffusion/etch stop barrier on the sidewalls of the trench above the etched back collar, and
forming the germanium counter-recrystallizing species in the node electrode top surface and in the buried strap with a dose greater than about 1E15 atoms/cm$^2$.

23. The method of claim 19 including forming a combination of the polysilicon and the germanium counter-recrystallizing species in at least one of the group consisting of the node electrode top surface and the buried strap.

* * * * *